United States Patent
Butt et al.

(10) Patent No.: US 6,571,383 B1
(45) Date of Patent: May 27, 2003

(54) SEMICONDUCTOR DEVICE FABRICATION USING A PHOTOMASK DESIGNED USING MODELING AND EMPIRICAL TESTING

(75) Inventors: Shahid Butt, Ossining, NY (US); Henning Haffner, Dresden (DE); Beate Frankowsky, Munich (DE)

(73) Assignee: Infineon Technologies, AG, Munich (DE)

(*) Notice: Subject to any disclaimer, the term of this patent is extended or adjusted under 35 U.S.C. 154(b) by 0 days.

(21) Appl. No.: 09/562,700

(22) Filed: Apr. 28, 2000

(51) Int. Cl.[7] .......................... G06F 17/50; G03C 5/00; G06K 9/00
(52) U.S. Cl. .................. 716/19; 716/4; 430/30; 382/149
(58) Field of Search .......................... 716/19, 20, 21, 716/4; 250/492.1, 492.22; 430/30, 4, 5; 382/144, 145, 147, 149

(56) References Cited

U.S. PATENT DOCUMENTS

| | | | | |
|---|---|---|---|---|
| 5,242,770 A | | 9/1993 | Chen et al. | |
| 5,256,505 A | | 10/1993 | Chen et al. | |
| 5,447,810 A | | 9/1995 | Chen et al. | |
| 5,663,893 A | | 9/1997 | Wampler et al. | |
| 5,707,765 A | | 1/1998 | Chen | |
| 5,723,233 A | | 3/1998 | Garza et al. | |
| 5,740,068 A | | 4/1998 | Liebmann et al. | |
| 5,821,014 A | | 10/1998 | Chen et al. | |
| 5,825,647 A | * | 10/1998 | Tsudaka | 364/167.03 |
| 5,827,623 A | | 10/1998 | Ishida et al. | |
| 5,851,702 A | | 12/1998 | Watanabe et al. | |
| 5,879,844 A | * | 3/1999 | Yamamoto et al. | 430/30 |
| 5,900,338 A | | 5/1999 | Garza et al. | |
| 5,900,340 A | | 5/1999 | Reich et al. | |
| 5,920,487 A | | 7/1999 | Reich et al. | |
| 6,033,814 A | * | 3/2000 | Burdorf et al. | 430/30 |
| 6,214,494 B1 | * | 4/2001 | Bula et al. | 430/5 |
| 6,335,981 B1 | * | 1/2002 | Harazaki | 382/144 |

OTHER PUBLICATIONS

Smith et al., "Investigation of OPC and Non–Uniformities on the Performance of Resistivity and Linewidth Measurements," Proc. IEEE 1999 Int. Conf. on Microelectronic Test Structures, vol. 12, pp. 161–166.*

Kotani et al., "High accurate process proximity correction based on empirical model for 0.18$\mu$m generation and beyond," Microprocesses and Nanotechnology Conference, Jun. 1999, pp. 94–95.*

Garofalo et al., "Automatic Proximity Correction for 0.35$\mu$m I–line Phtolithography," NUPAD 1994 IEEE, pp. 92–94.*

(List continued on next page.)

Primary Examiner—Matthew Smith
Assistant Examiner—Leigh Marie Garbowski
(74) Attorney, Agent, or Firm—Slater & Matsil, L.L.P.

(57) ABSTRACT

A method of fabricating a semiconductor device is outlined in FIG. 3. An ideal (or desired) pattern of a layer of the semiconductor device is designed (305). A first pass corrected pattern is then derived by correcting the ideal patterns for major effects, e.g., aerial image effects (315, 320). A second pass corrected pattern is then derived by correcting the first pass corrected patterns for remaining errors (304). The second pass corrected pattern can be used to build a photomask (345). The photomask can then be used to produce a semiconductor device, such a memory chip or logic chip (350).

51 Claims, 5 Drawing Sheets

OTHER PUBLICATIONS

Avanticorp.com;; Taurus–OPC, Optical Proximity Correction; Sep. 29, 1999 10 pages; www.avanticorp.com/Avanti/SolutionsProducts/Products/Item/,1172,33,00.html.

Chang–Nam Ahn, et al.; "A novel approximate mode for resist process", Optical Microlithography X, Santa Clara, CA Feb. 27, 1998, Proceedings of the SPIE – The International Society for Optical Engineering, 1998, SPIE–INT. SOC. OPT. ENG. USA, pp. 752–763.

Zhao, J, et al.; "Applications of enchanced optical proximity correction models", Optical Microlithography XI, Santa Clara, CA Feb. 27, 1998, Proceedings of the SPIE – The International Society for Optical Engineering, 1998, SPIE-INT. SOC. OPT. ENG. USA, pp. 234–244.

Dolainsky, C, et al.; "Evaluation of resist models for fast optical proximity correction", 17$^{th}$ Annual Symposium on Photomask Technology and Management, Redwood City, CA Sep. 19, 1997; Proceedings of the SPIE – The International Society for Optical Engineering, 1998, SPIE–INT. SOC. OPT. ENG., USA, pp.202–207.

Jungmann, A., et al.; "Benchmarking of software tools for optical proximity correction", Microlithography XI, Santa Clara, CA Feb. 27, 1998, Proceedings of the SPIE – The International Society for Optical Engineering, 1998, SPIE-INT, SOC. OPT. ENG. USA, pp. 921–931.

\* cited by examiner

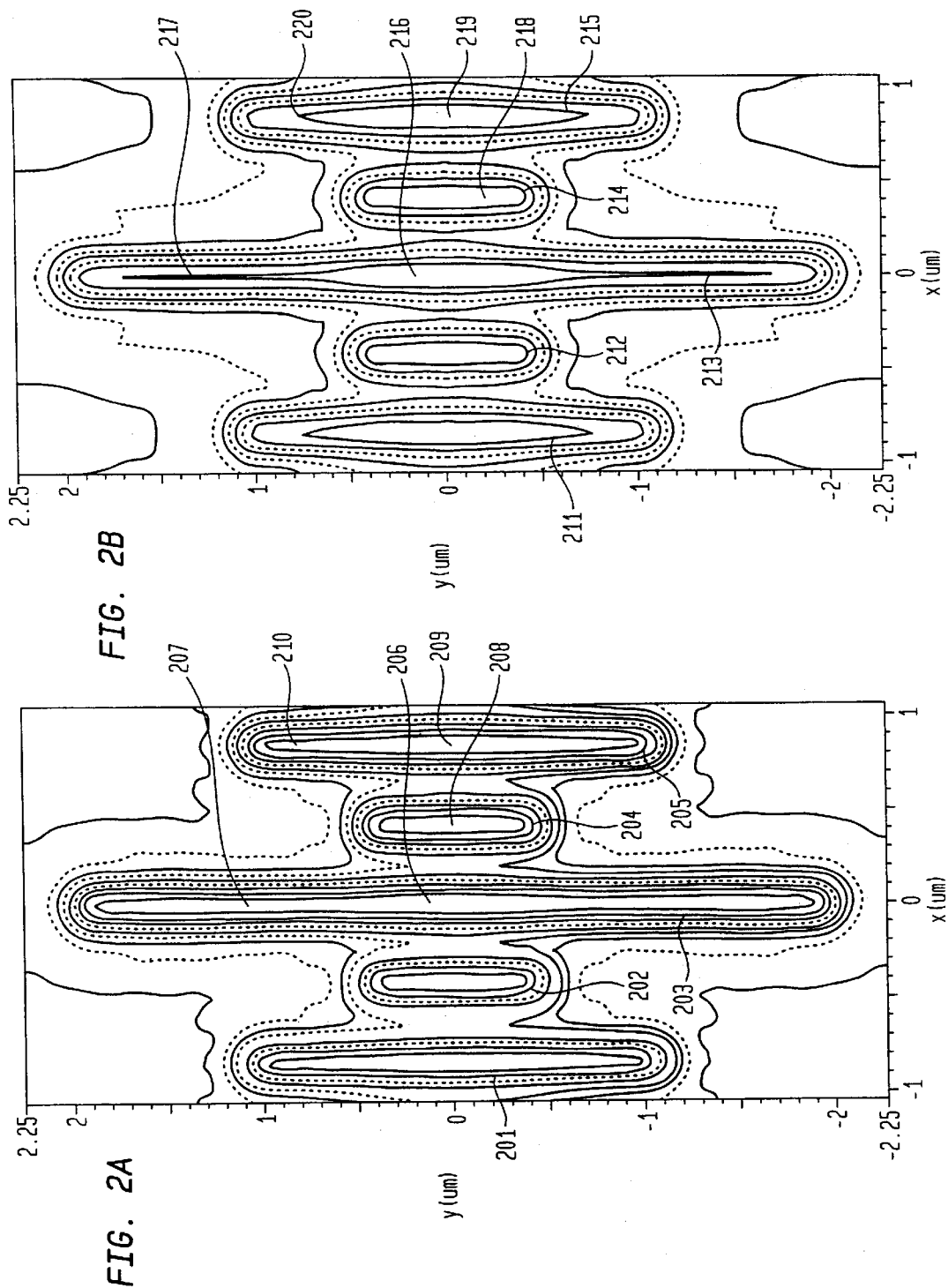

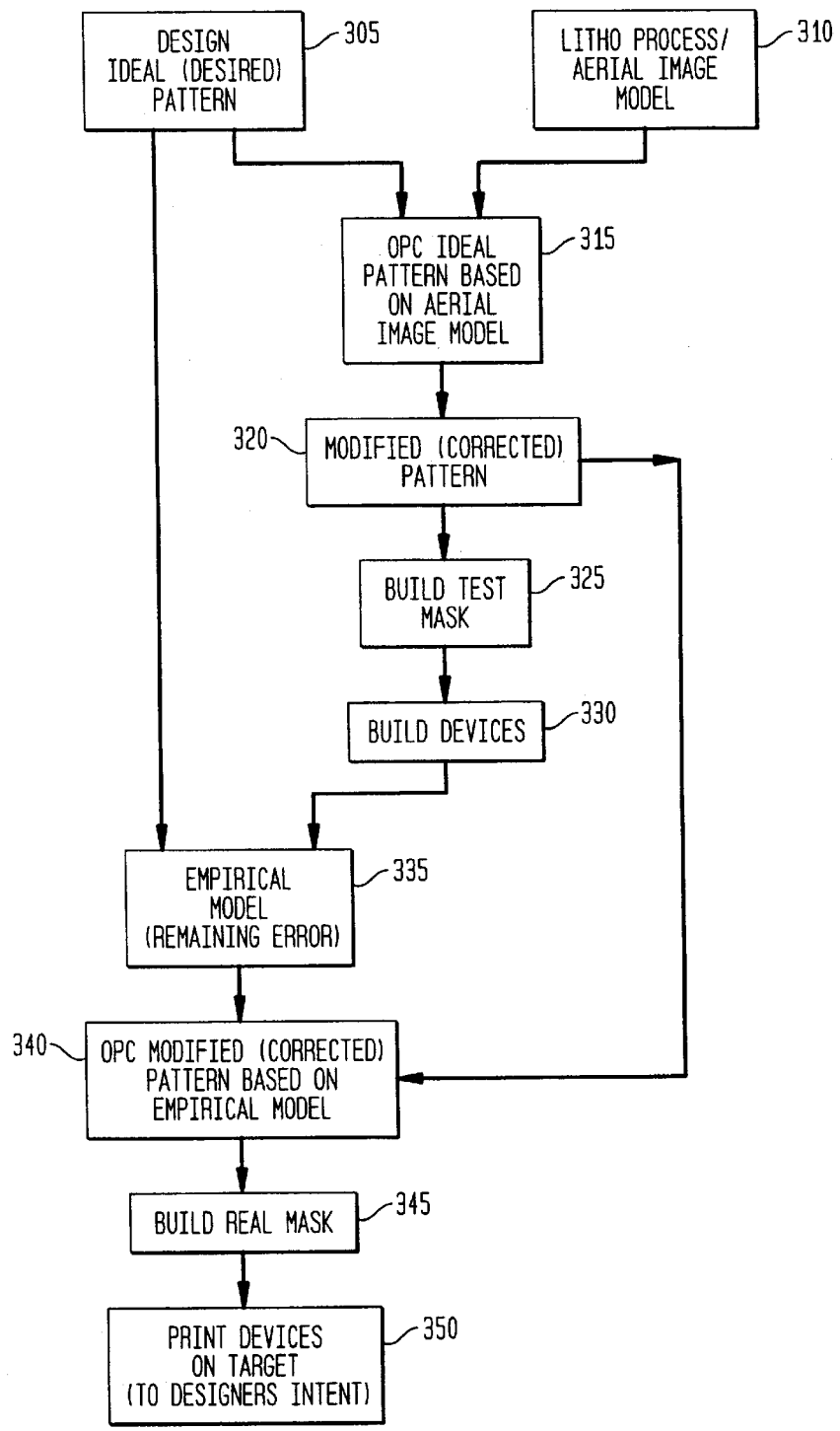

SEMICONDUCTOR DEVICE FABRICATION USING A PHOTOMASK DESIGNED USING MODELING AND EMPIRICAL TESTING

FIELD OF THE INVENTION

The present invention relates generally to semiconductor devices and photomasks and more particularly to semiconductor device fabrication using a photomask designed using modeling and empirical testing.

BACKGROUND OF THE INVENTION

The manufacture of semiconductor devices is heavily dependent on the accurate replication of computer-aided-design (CAD) generated patterns onto the surface of a device substrate. The replication process is typically performed using optical lithography followed by a variety of subtractive (e.g., etch) and additive (e.g., deposition) processes. Optical lithography patterning involves the illumination of a metallic coated quartz plate known as a photomask which contains a magnified image of the computer generated pattern. This illuminated image is reduced in size and patterned into a photosensitive film on the substrate.

As a result of the interference and processing effects which occur during pattern transfer, images formed on the substrate deviate from their ideal dimensions and shape as represented by the computer images. These deviations depend on the characteristics of the patterns as well as on a variety of process conditions. Because these deviations can significantly effect the performance of the semiconductor device, many approaches have been pursued which focus on CAD compensation schemes which ensure a resultant ideal image.

One such compensation scheme utilizes the selective biasing of mask patterns to compensate for the pattern distortions occurring during wafer processing. The term Optical Proximity Correction (OPC) is commonly used to describe this process of selective mask biasing, even though the trend exists to include pattern distortions unrelated to the optical image transfer. The idea of biasing patterns to compensate for image transfer infidelities has been commonly applied to E-beam lithography to counteract the effects of back scattered electrons, both in the writing of photo masks and in direct wafer writing operations.

Another known compensation technique is to add assist features, otherwise known as scattering bars or intensity leveling bars, to the photomask. Assist features are sub-lithographic features placed adjacent to a feature that is to be printed. Since these additional features are sub-lithographic, they will not be transferred to the resist during printing. They will, however, aid in sharpening the image that is printed.

SUMMARY OF THE INVENTION

In one aspect, the present invention is intended to correct the proximity effects that can cause severe pattern fidelity distortion on a wafer patterned by a lithographic process. This distortion is generally caused by aerial image effects as well as other contributors such as resist and etch. The total deviation from nominal created by these effects can create errors as great as 100 nm or more. Optical proximity correction (OPC), usually implemented as an automatic full-chip software solution, can be used to correct for the effects by modifying the mask pattern accordingly.

State of the art OPC solutions are making attempts to describe the overall process variation as accurately as possible and turn this error model into some correction model to be applied "in total" during automatic OPC to adjust the mask accordingly. Errors remaining from this kind of approach are easily in the range of tens of nanometers. These remaining errors are typically caused by the many error-adding steps included in the CD data collection and analysis process and in the limitations of building exact error and correction models as well as the generally high critical dimension errors that must be corrected for.

In one aspect, the present invention proposes a method that can be used for performing OPC, such that the deviations from design are first corrected with a "well known" model, typically a pure aerial image model, and then the residual error is corrected for by an empirical model obtained from a test mask that has gone through the same "well known" first correction as the design.

Accordingly, the preferred embodiment of the invention provides a method for correcting a given design from proximity effects. The method uses multiple correction passes such that known, typically major, effects are corrected in a first pass (or first passes) and the remaining errors are corrected in a second (or subsequent) pass hence minimizing the overall remaining error of the correction to a minimum.

As an example, an initial design may include a set of ideal patterns, e.g., patterns used to evaluate the process. These patterns would be modified (corrected) using a known model such as an aerial image model to adjust for patterning inaccuracy. A test mask would then be fabricated and a test structure or structures formed using the test mask. The patterns formed on the surface of the test chip would then be measured and compared with the ideal patterns. Based on this comparison, a remaining error model describing the remaining differences between the dimensions of the printed test patterns and the ideal patterns is generated. The already modified (corrected) set of ideal patterns can now be corrected even further in a second pass using the "remaining error model" as process description and the modified (corrected) set of ideal patterns as input.

A photomask could then be generated as by first applying the aerial image based OPC followed by correcting using the "remaining error model". Such a photomask can be a memory chip, processor or any other logic device that is then transferred to the surface of the wafers with high accuracy, meaning minimizing the differences between the dimensions of the ideal patterns (e.g., circuit designer's intent) and the printed pattern.

BRIEF DESCRIPTION OF THE DRAWINGS

The above features of the present invention will be more clearly understood from consideration of the following descriptions in connection with accompanying drawings in which:

FIG. 2A illustrates the pattern that might be transferred to the wafer if the photomask is not corrected when the image is in focus;

FIG. 2B illustrates a pattern as in FIG. 2A when the image is 0.5 um out of focus;

FIG. 3 provides a flow chart of a preferred embodiment of the present invention.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

The present invention will now be described using a specific example. It will be clear to one skilled in the art that the principles described with respect to the specific example can be extended to a number of semiconductor device applications.

Figure 1A:
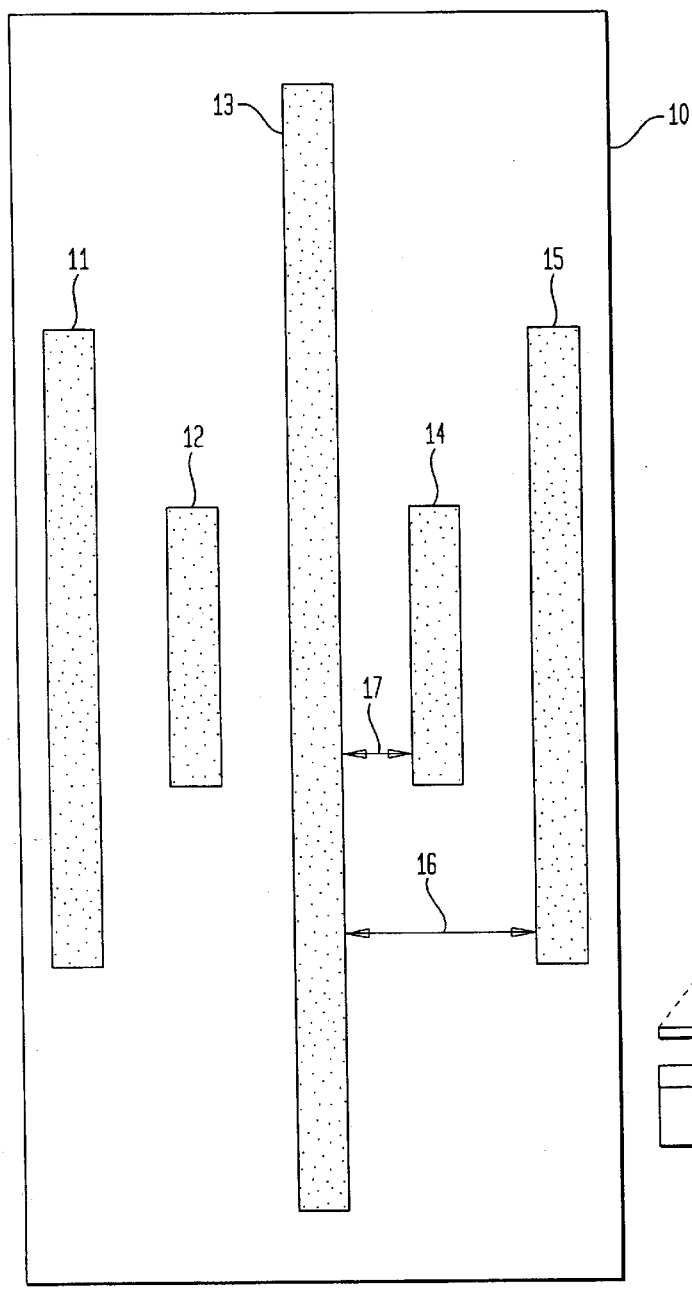
FIG. 1A illustrates a simplified pattern that is to be printed on a semiconductor device.
Figure 1B:
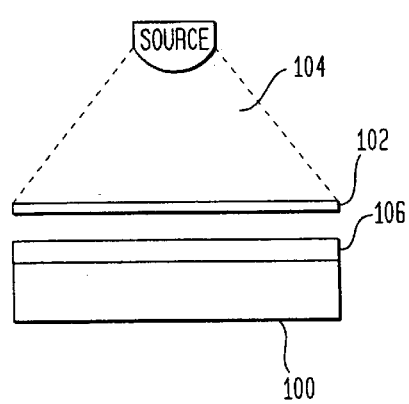
FIG. 1B illustrates a simplified schematic of a lithography exposure system.

FIG. 1A illustrates a pattern 10 that is to be transferred to a semiconductor wafer 100 using photolithographic techniques, as illustrated by FIG. 1B. For example, the elements 11–15 might all be polysilicon lines that are to be formed on the surface of the semiconductor device. In an ideal world, a photomask 102 would be formed that included the pattern 10. Light (or other radiation) 104 could then be transmitted through the photomask 102 and the pattern transferred onto a resist layer 106 formed over an upper surface of the semiconductor device 100. While FIG. 1b is illustrated to show that the entire wafer is printed at once, it is understood that in many processes only small portions of the wafer (e.g., less than all the chips on the wafer) are printed at a single time.

Unfortunately, due to optical proximity effects, the pattern 10 will not be reliably transferred to the photoresist. For example, FIGS. 2A and 2B illustrate the pattern that is transferred to the photoresist when the image is in focus (FIG. 2A) and out of focus by 0.5 um (FIG. 2B). If a threshold photoresist model is used and the dose is set to a value of 3.3 times the dose-to-clear (i.e., the dose just required to develop the resist in a large clear area), then intensities of less than or equal to 0.3 will print as lines in photoresist. These thresholds are labeled 201–205 in FIG. 2A and 211–215 in FIG. 2B. It is evident that the more isolated regions of the lines, e.g., 207 and 210 in FIG. 2A and 217 and 220 in FIG. 2B, print smaller than the more nested regions, e.g., 206, 208 and 209 in FIG. 2A and 216, 218 and 219 in FIG. 2B.

The methodology proposed in the first embodiment aspect of this invention is based on the idea that, as the lithography tools mature and the mask writing capabilities improve, it is becoming possible to describe a lithographic process with a reasonable accuracy using a pure aerial image model. Therefore, the proximity behavior, which is largely dominated by lithographic behavior, can be approximated to a reasonable degree using a pure aerial image model. The deviations from this aerial image model can then be described using an empirical model or a theoretical model. These deviations are largely due to the resist behavior and etch characteristics of a particular process.

FIG. 3 illustrates a flow chart of a first embodiment process for manufacturing a semiconductor device. In step 305, an ideal (desired) pattern of a layer of the semiconductor device is designed. This ideal or desired pattern represents the designer's intent. If not for proximity effects, this desired pattern could be formed on the photomask and used to produce the semiconductor devices.

In this context, the desired pattern means the pattern that is desired to be on a semiconductor chip printed using this mask. The desired pattern may be the result of a circuit design and therefore represent portions of devices, e.g., transistor gates or metal interconnects. More often, however, the desired pattern is derived by a process engineer whose goal is to characterize the process and thereby obtain the OPC information necessary to build a product. In this case, the designer's intent may just be test structures, for example various shaped and sized structures positioned at varying distances from one another.

In step 310, a major effect model is derived. This major effect model may be an aerial image model and may further account for resist and/or etch effects. In different embodiments the major effect model may be determined before or after the ideal pattern is derived.

In step 315, the ideal pattern is optical proximity corrected. The optical proximity correction is based on the major effect (e.g., aerial image) model. A first pass corrected pattern is generated by modifying the ideal pattern using the optical proximity correction. This is shown in step 320.

In steps 325 and 330, a test mask is built and used to build test structures. The test structures may be the same as or different than the first pass corrected desired pattern, nevertheless any patterns that are used would need to be first pass corrected. Using information about the ideal pattern, an empirical model can be derived by empirically modeling the test structures, as noted by step 335. In one embodiment, the test structures are electrically tested to determine the empirical model.

A second pass corrected pattern is then generated by modifying the ideal pattern further using an optical proximity correction on the first pass corrected pattern. This is shown in step 340. The optical proximity correction is based on the empirical model.

A photomask that includes the second pass corrected pattern can then be built. As noted by step 345, this mask might be considered the "real" mask. This label is used since the photomask is used to produce the semiconductor device as in step 350. In exemplary embodiments, this device might include a memory chip (e.g., DRAM) or a logic device (e.g., a microprocessor or digital signal processor).

At some point in the photomask modification either serifs and/or assist features can be added to the mask layout. As an example, these features may be added along with or prior to the modifications made based on the aerial image model. Alternatively, these features can be added along with the modifications made based on the empirical model or in a totally different step.

It is also noted that the process may include other steps that are known in the art. For example, the process could include a clean up step to improve mask manufactureability. This clean up step could be performed either before or after the "final" pattern is generated.

In the preferred embodiment, this methodology is implemented by building a "corrected" OPC test mask, using the pure aerial image model to describe the corrections. Test wafers are then patterned using this mask and run through a certain range of processes for a given level. The deviations from the design CD (critical dimension) are then modeled and this empirical model is then used to correct the already first pass modified ideal (desired) design (using the same pure aerial image model as for the first pass correction of the test mask) again in a second, subsequent OPC pass. Alternatively, the process could be described by the aerial image and a second theoretical model that accurately describes resist behavior and etch.

Furthermore, there is no need to restrict the application of this approach to a single pass (or the aerial image model). A more sophisticated model which already includes the impact of develop and etch can be used to obtain a finer OPC correction since the second pass would have to correct only the small residual errors of the first pass.

OPC software packages which are commercially available use a perturbed aerial image model to describe the whole process, e.g., resist develop, etch, and so on. This methodology has some short comings since the perturbed aerial image model does not describe the lithographic process accurately and secondly by adjusting optical parameter to obtain a better fit the model is not valid when the process conditions are not ideal or for other more complicated structures or two-dimensional affects, e.g. focus deviations and other variations.

Figure 4:
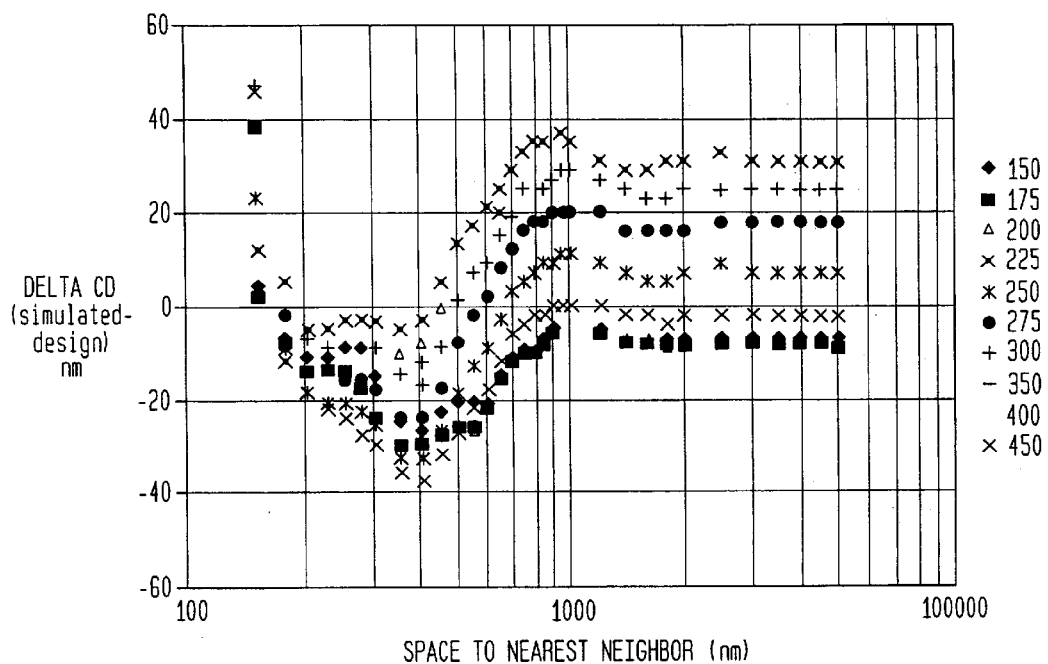
FIGS. 4–6 provide a set of plots that demonstrate one advantage of the preferred embodiment.
Figure 5:
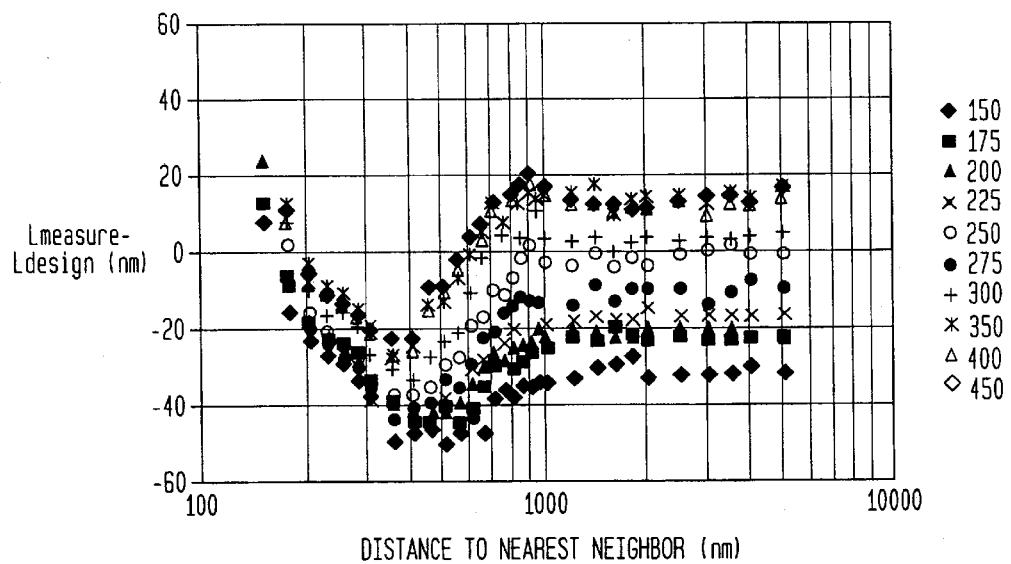
Figure 6:
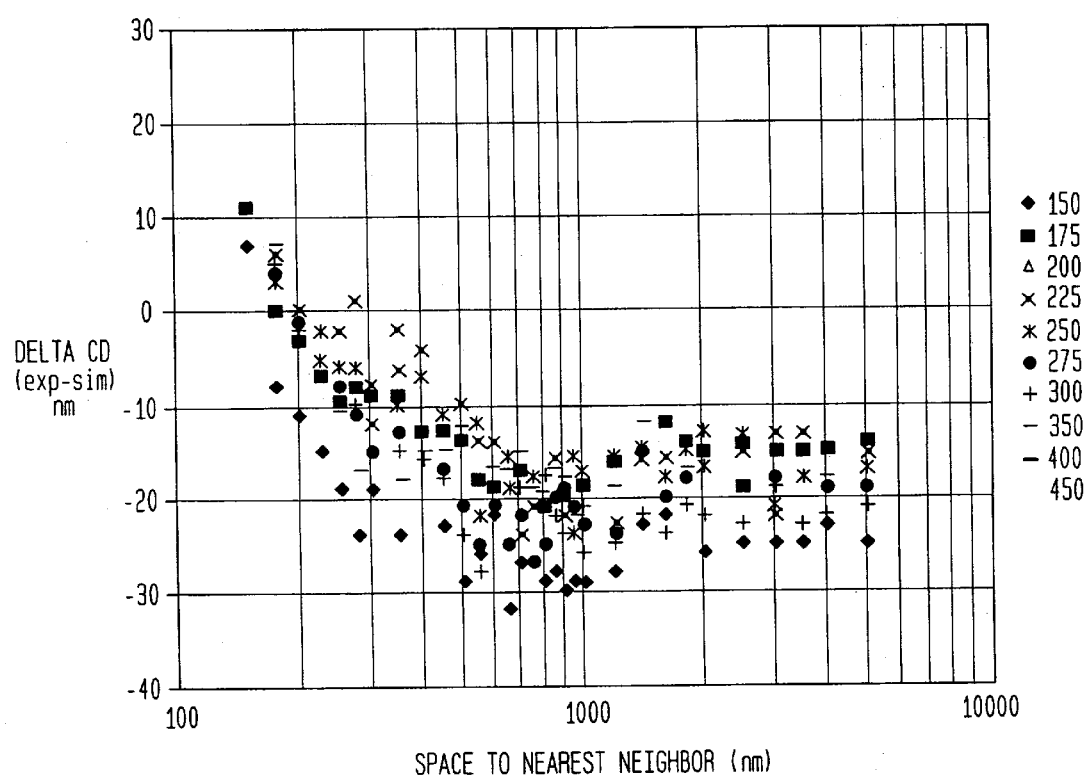

FIGS. 4–6 can be used to demonstrate the merit of the present invention. FIG. 4 shows a simulated aerial image OPC curve, at develop. FIG. 5 shows experimental data obtained using the same lithographic conditions as the simulated one. The difference in the proximity behavior described by the simulations and the real data is shown in FIG. 6.

It can be seen from FIG. 6 that the differences between the simulated OPC curve (FIG. 4) and the measured OPC curve (FIG. 5) are in the range of 20 to 30 nm (much smaller than the total deviations). These differences are likely attributable to the resist, mask CD errors and metrology errors. Nevertheless, it is possible to account for the deviations by using an empirical model. While the curves shown above do not include the impact of etch, it is easy to imagine that because of the smaller remaining error the correction would be more accurate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of manufacturing a photomask, the method comprising:

designing a set of desired patterns;

deriving a set of first pass corrected patterns by correcting the desired patterns to compensate for major processing effects;

building a test mask with patterns based on the set of first pass corrected patterns;

building test structures based on the test mask;

deriving a set of second pass corrected patterns by correcting the first pass corrected patterns using information based upon the test structures built based on the test mask; and manufacturing a photomask based at least in part on the second pass corrected patterns.

2. The method of claim 1 wherein the major effects comprise aerial image effects.

3. The method of claim 2 wherein the major effects further comprise resist effects.

4. The method of claim 2 wherein the major effects further comprise etch effects.

5. The method of claim 1 and further comprising determining remaining errors that exist in the first pass corrected patterns wherein the remaining errors are determined by empirical testing of the test structures.

6. The method of claim 5 wherein the test structures are based on a set of test patterns that are different than the desired patterns, and wherein the remaining errors are determined by empirical testing of the set of test patterns that are different than the desired patterns.

7. The method of claim 5 wherein the test structures are based on the first pass corrected patterns.

8. The method of claim 5 wherein the remaining errors are determined by empirical testing of electrical characteristics of the test structures.

9. The method of claim 1 wherein the first pass corrected patterns are derived using a theoretical model.

10. The method of claim 5 wherein the remaining errors include errors due to effects of resist behavior.

11. The method of claim 5 wherein the remaining errors include errors due to effects of etch characteristics.

12. The method of claim 1 wherein the set of first pass corrected patterns include serifs.

13. The method of claim 1 wherein the photomask includes assist features disposed between selected ones of the second pass corrected patterns.

14. The method of claim 1 wherein designing a set of desired patterns comprises designing a semiconductor integrated circuit.

15. The method of claim 14 wherein the semiconductor integrated circuit comprises a dynamic random access memory.

16. The method of claim 14 wherein the semiconductor integrated circuit comprises a logic chip.

17. A method of generating patterns for a photomask, the method comprising:

designing an ideal pattern;

providing an aerial image model;

generating a first pass corrected pattern by modifying the ideal pattern using an optical proximity correction on the ideal pattern, the optical proximity correction being based on the aerial image model;

building a test mask;

building test structures based on the test mask;

deriving an empirical model by empirically modeling the test structures; and generating a second pass corrected pattern by modifying the ideal pattern using an optical proximity correction on the first pass corrected pattern, the optical proximity correction being based on the empirical model.

18. The method of claim 17 wherein the test mask includes a test pattern different than the first pass corrected pattern.

19. The method of claim 18 wherein the test pattern used in deriving the empirical model comprises a first pass corrected test pattern using the same optical proximity correction as when generating a first pass corrected pattern.

20. The method of claim 17 wherein the test mask includes at least a portion of the first pass corrected pattern.

21. The method of claim 17 wherein the empirical model is derived after the first pass corrected pattern is generated.

22. The method of claim 17 generating a first pass corrected pattern by modifying the ideal pattern using an optical proximity correction on the ideal pattern comprises using an optical proximity correction that is based on the aerial image model and a resist model.

23. The method of claim 17 wherein providing an aerial image model comprises deriving an aerial image model.

24. The method of claim 23 wherein the ideal pattern is designed before the aerial image model is derived.

25. The method of claims 23 wherein the ideal pattern is designed after the aerial image model is derived.

26. A method of manufacturing a photomask, the method comprising:

providing a set of ideal patterns to be incorporated in a design;

generating a set of modeled patterns by modifying the shapes of the ideal patterns using an aerial image model;

fabricating a test mask that includes the modeled patterns;

fabricating a test wafer using the test mask, the fabricating including forming test structures on the surface of the wafer;

measuring the test structures formed on the surface of the wafer;

comparing the measured test structures with the ideal patterns;

generating a set of corrected patterns by modifying the shapes of the modeled patterns based on the comparison of the measured test structures and the ideal patterns; and fabricating a photomask that includes the corrected patterns.

27. The method of claim 26 wherein generating a set of modeled patterns by modifying the shapes of the ideal patterns using an aerial image model comprises modifying the shapes of the ideal patterns using an aerial image model and a resist model.

28. The method of claim 26 wherein measuring the test structures comprises measuring at least one electrical characteristic of the test structures.

29. A method of manufacturing a semiconductor device, the method comprising:

designing an ideal pattern of a layer of the semiconductor device;

deriving a first pass corrected pattern by correcting the ideal pattern for major effects;

building a test mask with patterns based on the set of first pass corrected pattern;

building a test wafer based on the test mask;

determining remaining errors in the first pass corrected pattern from the test wafer;

deriving a second pass corrected pattern by correcting the first pass corrected pattern for the remaining errors;

building a photomask that is based on the second pass corrected pattern; and using the photomask to produce a semiconductor device.

30. The method of claim 29 wherein the semiconductor device comprises a memory chip.

31. The method of claim 30 wherein the semiconductor device comprises a dynamic random access memory chip.

32. The method of claim 29 wherein the semiconductor device comprises a logic chip.

33. The method of claim 29 wherein the major effects comprise aerial image effects.

34. The method of claim 29 wherein the remaining errors are determined by empirical testing of the test wafer.

35. The method of claim 34 wherein the remaining errors are determined by empirical testing of at least one test pattern that is different than the ideal pattern.

36. The method of claim 35 wherein the first pass corrected pattern is derived using an optical proximity correction and wherein the at least one test pattern comprises a first pass corrected test pattern.

37. The method of claim 29 wherein the remaining errors are determined by empirical testing of the set of first pass corrected patterns.

38. A method of manufacturing a semiconductor device, the method comprising:

designing an ideal pattern of a layer of the semiconductor device;

deriving a major effect model;

generating a first pass corrected pattern by modifying the ideal pattern using an optical proximity correction on the ideal pattern, the optical proximity correction being based on the major effect model;

building a test mask;

building test structures based on the test mask;

deriving an empirical model by empirically modeling the test structures;

generating a second pass corrected pattern by modifying the ideal pattern using an optical proximity correction on the first pass corrected pattern, the optical proximity correction being based on the empirical model;

building a photomask that includes the second pass corrected pattern; and using the photomask to produce the semiconductor device.

39. The method of claim 38 wherein the major effect model comprises a model based on an aerial image model, a resist model and an etch model.

40. The method of claim 38 wherein the major effect model comprises an aerial image model.

41. The method of claim 40 wherein the major effect model further comprises a resist model.

42. The method of claim 40 wherein the major effect model further comprises an etch model.

43. The method of claim 38 wherein the empirical model is used to correct errors remaining after the optical proximity correction based on the major effect model.

44. The method of claim 43 wherein the test structures comprise structures that are different than the ideal pattern.

45. The method of claim 43 wherein the test structures comprise structures that are substantially the same as the first pass corrected pattern.

46. The method of claim 38 wherein the semiconductor device comprises a memory chip.

47. The method of claim 46 wherein the semiconductor device comprises a dynamic random access memory chip.

48. A method of manufacturing a semiconductor device, the method comprising:

designing an ideal pattern of a layer of the semiconductor device;

performing at least one correction pass to correct the ideal pattern for major effects and to generate a first pass corrected pattern;

forming at least one test device based upon the first pass corrected pattern;

using the at least one test device to determine remaining errors in the first pass corrected pattern;

performing at least one correction pass to correct the remaining errors in the first pass corrected pattern and to generate a second pass corrected pattern;

building a photomask that includes the second pass corrected pattern; and using the photomask produce a semiconductor device.

49. The method of claim 46 wherein performing at least one correction pass to correct the ideal pattern comprises performing more than one correction pass.

50. The method of claim 49 wherein performing at least one correction pass to correct the first pass corrected pattern comprises performing more than one correction pass.

51. The method of claim 48 wherein performing at least one correction pass to correct the first pass corrected pattern comprises performing more than one correction pass.

* * * * *